United States Patent
Bauser et al.

[19]

[11] Patent Number: 6,108,263

[45] Date of Patent: Aug. 22, 2000

[54] MEMORY SYSTEM, METHOD FOR VERIFYING DATA STORED IN A MEMORY SYSTEM AFTER A WRITE CYCLE AND METHOD FOR WRITING TO A MEMORY SYSTEM

[75] Inventors: Philippe Bauser, Segny; Alexis Marquot, Arenthon, both of France; Craig Swift, Austin, Tex.

[73] Assignee: Motorola, Inc., Schaumburg, Ill.

[21] Appl. No.: 09/373,305

[22] Filed: Aug. 12, 1999

[51] Int. Cl.[7] ............................ G11C 13/00; G11C 16/06
[52] U.S. Cl. .................. 365/230.01; 365/189.01
[58] Field of Search ................ 365/218, 230.01, 365/189.01, 226

[56] References Cited

U.S. PATENT DOCUMENTS 5,313,429   5/1994   Chevallier et al. ............... 365/226

FOREIGN PATENT DOCUMENTS 2308701   2/1997   United Kingdom ............ G11C 16/06

*Primary Examiner*—Terrell W. Fears

[57] ABSTRACT

A memory system (20) comprising a memory array (22) having a plurality of memory cells (42) arranged in rows and columns. Each memory cell (42) has a control terminal. A voltage controller (26) provides to the control terminal of a memory cell a first verify voltage signal (Vabse) during a first verify cycle or a second verify voltage signal (Vabsp) during a second verify cycle. The first verify voltage signal (Vabse) having a predetermined voltage level that corresponds substantially to a threshold voltage level of a memory cell in the array in a first state and the second verify voltage signal (Vabsp) having a predetermined voltage level that corresponds substantially to a threshold voltage level of a memory cell in the array in a second state.

20 Claims, 3 Drawing Sheets

MEMORY SYSTEM, METHOD FOR VERIFYING DATA STORED IN A MEMORY SYSTEM AFTER A WRITE CYCLE AND METHOD FOR WRITING TO A MEMORY SYSTEM

FIELD OF THE INVENTION

This invention relates to a memory system, a method for verifying data stored in a memory system after a write cycle and a method for writing to a memory system. More particularly, this invention relates to erasable non-volatile memory systems.

BACKGROUND OF THE INVENTION

An erasable non-volatile memory device, like other memory devices, comprises a plurality of memory cells arranged in an array of rows and columns with a bit line connecting the memory cells located in each column. Each memory cell includes at least one transistor or other storage device for storing one bit of data.

Some erasable non-volatile memory devices, like the electrically erasable and programmable read-only memory (EEPROM) device described in U.S. patent application Ser. No. 09/124466 (having Attorney Docket No. SC-90891A), entitled 'Method and Apparatus for Writing an Erasable Non-Volatile Memory' assigned to the assignee hereof, and the subject matter of which is incorporated herein by reference thereto, require a verification scheme to verify that the memory cells have been written to correctly after a write access (i.e. an erase cycle or a program cycle for EEPROM). Typically this is performed by means of a conventional read cycle. In the case of 'smart programming', after a write access, data is read back from the memory. If the data read back does not match the data to be written to the memory, then another write cycle is initiated. If the data read back does match, then a predetermined number of additional write cycles are initiated. These additional write cycles are required to ensure that the memory has been written to correctly with some margin. However, these additional write cycles can cause stress on the memory cells which may result in the degradation of the programmability of the cell.

There is therefore a need to provide an improved method for verifying data stored in a memory cell after a write cycle which addresses the above problem.

BRIEF DESCRIPTION OF DRAWINGS

A preferred embodiment of the present invention will now be described with reference to the accompanying drawings in which.

DETAILED DESCRIPTION OF DRAWINGS

Figure 1:
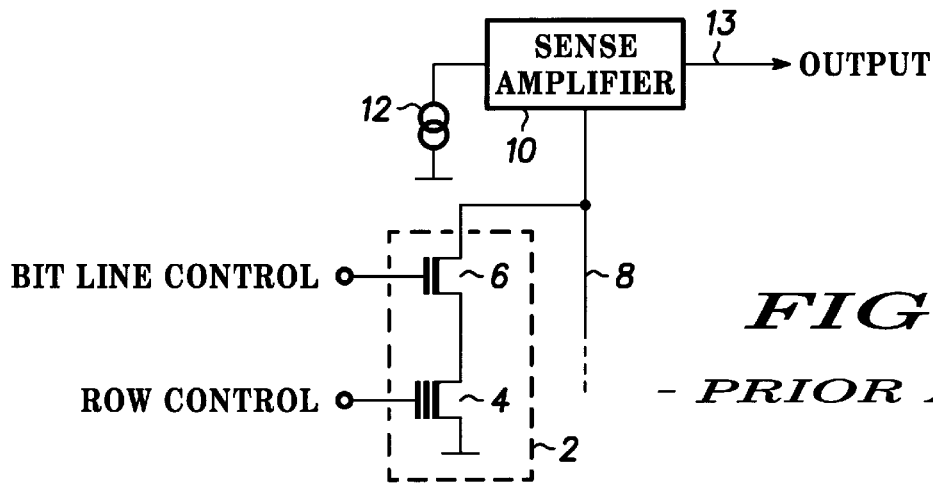
FIG. 1 is a simplified schematic diagram of part of a memory array.

In accordance with one aspect of the present invention there is provided a memory system comprising:

a memory array having a plurality of memory cells arranged in rows and columns, wherein each memory cell has a control terminal; and a voltage controller for providing to the control terminal of a memory cell a first verify voltage signal during a first verify cycle or a second verify voltage signal during a second verify cycle, the first verify voltage signal having a predetermined voltage level that corresponds substantially to a threshold voltage level of a memory cell in the array in a first state and the second verify voltage signal having a predetermined voltage level that corresponds substantially to a threshold voltage level of a memory cell in the array in a second state.

In accordance with a second aspect of the present invention there is provided a method for verifying data stored in a memory array after a write cycle, the memory array comprising a plurality of memory cells arranged in rows and columns, each memory cell having a control terminal, the method comprising the steps of:

performing an erase verify cycle on a memory cell to be erased comprising the steps of:
applying an erase verify voltage signal to the control terminal of the memory cell, the erase verify voltage signal having a predetermined voltage level that corresponds substantially to a threshold voltage level of an erased memory cell in the array, and
reading the data stored in the memory cell and in response providing an erase verify signal, the erase verify signal having a first value when the data switches to an erased state and a second value when the data is in the programmed state;

performing a program verify cycle on a memory cell to be programmed comprising the steps of:
applying a program verify voltage signal to the control terminal of the memory cell, the program verify voltage signal having a predetermined voltage level that corresponds substantially to a threshold voltage level of a programmed memory cell in the array, and
reading the data stored in the memory cell and in response providing a program verify signal, the program verify signal having a third value when the data switches to a programmed state and a fourth value when the data cell is in the erased state; and terminating a write access when the erase verify signal is at the first value and the program verify signal is at the third value.

In accordance with a third aspect of the present invention there is provided a method for writing to a memory array, the memory array comprising a plurality of memory cells arranged in rows and columns, each memory cell having a control terminal, the method comprising the steps of:

performing an erase cycle which includes applying an erase voltage signal to the control terminal of a memory cell;

performing an erase verify cycle on a memory cell to be erased comprising the steps of:
applying an erase verify voltage signal to the control terminal of the memory cell, the erase verify voltage signal having a predetermined voltage level that corresponds substantially to a threshold voltage level of an erased memory cell in the array, and
reading the data stored in the memory cell and in response providing an erase verify signal, the erase verify signal having a first value when the data switches to an erased state and a second value when the data is in the programmed state;

performing a program cycle which includes applying a program voltage signal to the control terminal of a memory cell;

performing a program verify cycle on a memory cell to be programmed comprising the steps of:

applying a program verify voltage signal to the control terminal of the memory cell, the program verify voltage signal having a predetermined voltage level that corresponds substantially to a threshold voltage level of a programmed memory cell in the array, and reading the data stored in the memory cell and in response providing a program verify signal, the program verify signal having a third value when the data switches to a programmed state and a fourth value when the data cell is in the erased state;

repeating the erase cycle and erase verify cycle until the erase verify signal is at the first value; and repeating the program cycle and program verify cycle until the program verify signal is at the third value.

The present invention will be described with reference to an EEPROM device comprising two-transistor memory cells. This is for illustrative purposes only. The invention may be used with devices having 1-transistor memory cells, 3-transistor memory cells or the like. In addition, the invention may also be used with Flash EEPROM devices. It is not intended that the invention be limited to the specific embodiment disclosed in the following description.

A conventional method for verifying the contents of a memory array after a write access will now be described with reference to FIG. 1. FIG. 1 is a simplified diagram showing one memory cell 2 of an EEPROM memory array. The memory array (not shown) comprises a plurality of the memory cells 2 arranged in columns and rows, with each column having a corresponding bit line.

The memory cell 2 is a two-transistor memory cell comprising a select transistor 6 and preferably a floating gate transistor 4. The floating gate of the transistor 4 traps a charge when the memory cell is programmed. The select transistor 6 has conduction terminals coupled between a bit line 8 and the drain terminal of floating gate transistor 4. A bit line control is coupled to the control terminal of the select transistor 6 and to the control terminals of the select transistors of the other memory cells (not shown) in the same column. A sense amplifier 10 having a current source 12 is coupled to the bit line 8.

A row control is coupled to the control terminal of the floating gate transistor 4 and to the control terminals of the floating gate transistors of the other memory cells (not shown) in the same row. During a programming cycle, the voltage signal on the row control will be at a sufficient level to allow programming. During an erase cycle, the voltage signal on the row control will be at a sufficient level to allow erasing. During a read cycle, the voltage signal on the row control will be at a sufficient level to allow reading.

When the select transistor 6 is conductive (e.g. when the signal on the bit line control is high), the select transistor 6 couples the floating gate transistor 4 to bit line 8 and the sense amplifier 10. Thus, by applying the appropriate voltage signals on the bit line control and the row control, an individual memory cell in the array can be selected to be erased, or programmed or read. In the array, there will be a row control per row and a bit line control per column. By controlling the signals on the bit line controls and the row controls, bytes of cells in a row or whole rows or whole blocks of cells or even the whole array can be selected.

In the following description, a memory cell is defined as erased when the floating gate device is in its non-conductive state, corresponding to a logic '0' and a memory cell is defined as programmed when the floating gate device is in its conductive state, corresponding to a logic '1'. Of course, the opposite polarity may alternatively be used. When the memory cell 2 is programmed, the floating gate of the transistor 4 traps a charge. The trapped charge modifies a threshold voltage of the transistor 4 in the memory cell. The threshold voltage of a programmed memory cell is lower than the threshold voltage of an erased memory cell. The threshold voltage of the transistor 4 determines the current that the memory cell can sink.

During a program cycle, the row control associated with the cell to be programmed is biased to a high negative program voltage, such as −12 to −15 volts, the associated bit line of the cell to be programmed is then biased to a moderately high positive voltage with respect to the row control, such as +3.5 volts, and the select transistor 6 of the cell is rendered conductive such that the floating gate transistor of the cell is programmed to a conductive state. A given row has a plurality of bit lines each corresponding to a cell in the row. Since the row control runs through multiple bits in a given row, it is desirable to isolate those cells that are to remain in an erased state and prevent programming. This is done by applying a bias voltage to the bit lines associated with cells that are not to be programmed. The biasing voltage is at ground or a low voltage level, such as −1 volts. Similarly, row controls for unselected rows are isolated by applying a bias voltage of about +3.5 volts to the row control. Biasing the unselected control lines minimises any bit line disturbance or any band-to-band tunneling effects.

During an erase cycle, the row control associated with the cell to be erased is biased at a high positive erase voltage, such as +12 to +15 volts, the bit line of the cell to be erased is biased at a low voltage, such as −1 volts, and the select transistor 6 of the cell is rendered conductive such that the charge stored on the floating gate transistor is changed to an erased state. At completion of the erase cycle, the floating gate transistor is charged to a threshold voltage which is sufficient to prevent conduction during a read operation. If all the bit lines are held at a low voltage, all the cells in the row will be erased. Any number of control lines may be biased simultaneously, allowing block and bulk erase. For block erase, multiple rows in the memory array are erased at one time. For bulk erase, all rows are erased at the same time.

As mentioned in the introduction, in order to ensure that data has been correctly written to a memory, the contents of the memory need to be verified after a write cycle (erase cycle and/or program cycle).

In order to verify that the memory cell 2 is correctly programmed or erased after a write cycle to the memory cell 2, the bit line 8 is pre-charged to a voltage value of typically around 1 volt. A voltage signal is applied on the bit line control to render the select transistor 6 conductive and to thereby couple the floating gate transistor 4 to the bit line 8. A read voltage signal corresponding to a normal read cycle, such as 0 volts, is applied to the row control and hence the control terminal of the floating gate transistor 4. The conduction of the memory cell 2 is then evaluated by the sense amplifier 10 by comparing the value of the current conducted by this cell with a reference current provided by current source 12.

In the example described herein, the floating gate transistor of a programmed memory cell has a low threshold voltage (typically below 0 volts) which means that during a verify read cycle, such a cell will be conductive and so will lower the voltage on the pre-charged bit line. The floating gate transistor of an erased memory cell has a high threshold voltage (typically greater than 0 volts) which prevents conduction during a read cycle and which means that during a verify read cycle, such a cell will be non-conductive and so will not change the voltage on the pre-charged bit line. It will of course be appreciated that the threshold voltages of a programmed memory cell may be higher than that of an erased memory cell: the threshold voltage depends on the cell structure and manufacturing process. The sense amplifier 10 detects whether the voltage on the bit line is lowered to the level that corresponds to a programmed cell or remains the same by comparing the current sunk by the cell with the reference current. When the current sunk by the cell is equal to or greater than the reference current, then the sense amplifier 10 detects that the cell is programmed. If the current sunk by the cell is less than the reference current, then the sense amplifier 10 detects that the cell 2 is erased. In response, the sense amplifier provides an output signal at output 13 having a logic state which is indicative as to whether the memory cell 2 is erased or programmed.

The output signal is used by a memory controller (not shown) to ensure that the write cycle is repeated until the cell is correctly programmed or erased with margin. After each write cycle, the contents of the cell 2 must be verified.

Depending on the way the sense amplifier 10 works, which depends on how the reference current is generated, such a method can perform reasonably well in the case when the cell is to be programmed during the write cycle. However, in the case of when the cell is to be erased during the write cycle, this method is unable to provide reliable information as to how far the threshold voltage of the floating gate transistor of the cell has been raised. There is therefore a risk of overstressing the memory cell since the write operation is prolonged in order to gain margin.

The invention overcomes this problem of overstressing the memory cell by monitoring the threshold voltage of the memory cells using absolute voltage references in order to stop the write cycle as soon as the desired threshold voltage has been reached.

A preferred embodiment of the invention will now be described with reference to FIGS. 2–6 of the accompanying drawings.

Figure 2:
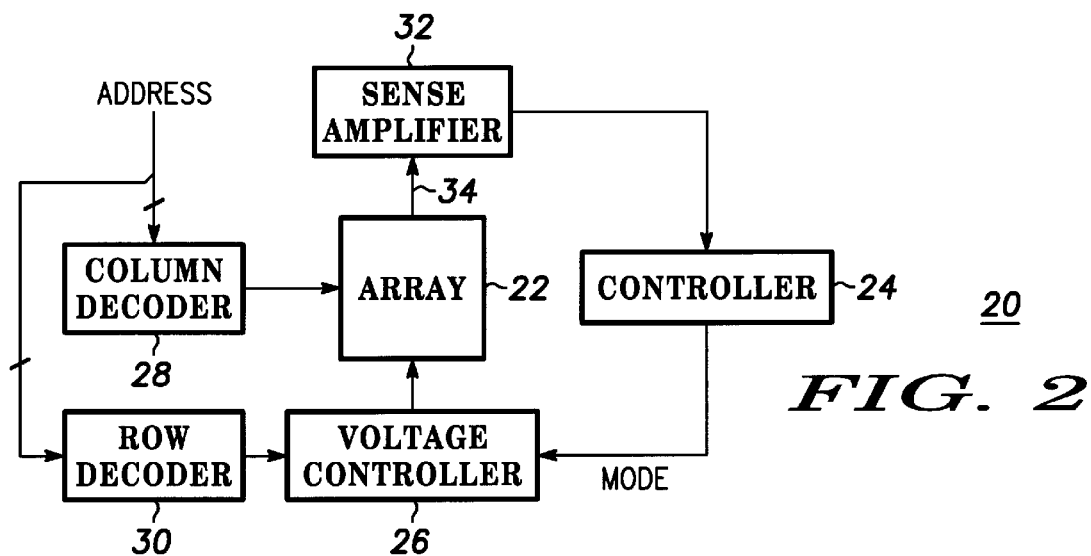
FIG. 2 is a block schematic diagram of a memory system in accordance with a preferred embodiment of the present invention.
Figure 3:
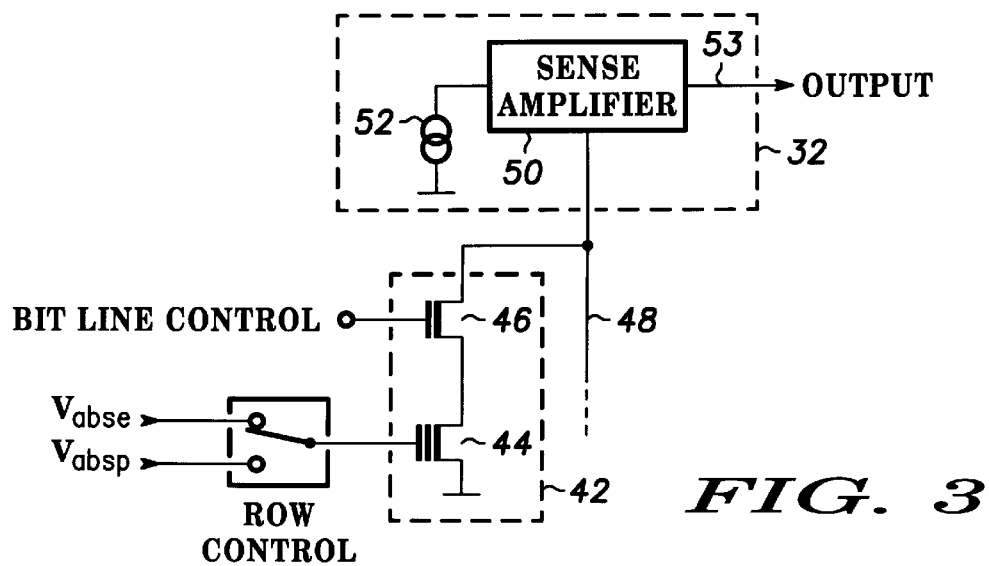
FIG. 3 is a simplified schematic diagram of part of the memory array shown in FIG. 2.

Referring now to FIG. 2, a memory system 20 in accordance with a preferred embodiment of the present invention comprises a memory array 22, a voltage controller 26 for providing voltage signals to the memory array 22 and a memory controller 24 for controlling operation of the memory array 22 and voltage controller 26. The memory array comprises a plurality of memory cells, one of which 42 is shown in FIG. 3, arranged in rows and columns and a plurality of bit lines associated with the columns. Column decoder 28 receives address signals, decodes the address signals and generates column select signals for selecting columns of the memory cells in the array 22 via bit line control (shown in FIG. 3). Row decoder 30 receives address signals, decodes the address signals and generates row select signals for selecting rows of the memory cells in the array 22. These row select signals are coupled to the voltage controller 26 such that appropriate voltage signals are applied to the row control line (shown in FIG. 3) of each row. Circuitry 32 is coupled to memory array 22 via a data bus 34 and has an output coupled to the memory controller 24. The memory system 20 could be part of a data processing system which includes a non-volatile erasable memory.

FIG. 3 is a schematic diagram showing one memory cell 42 of the memory array 22 coupled to its associated bit line 48 and to a sense amplifier 50. Sense amplifier 50 and current source 52 form part of circuitry 32 of FIG. 2. The arrangement of FIG. 3 is similar to FIG. 1 except that during a verify cycle, the voltage signal applied to the row control of the memory cell 42 is an absolute voltage as opposed to the read voltage signal. For an erase verify cycle, an erase verify voltage signal Vabse is applied to the row control and for a program verify cycle, a program verify voltage signal Vabsp is applied to the row control. Like components to those of FIG. 1 are referred to by the same reference numeral plus the number 40.

Figure 4:
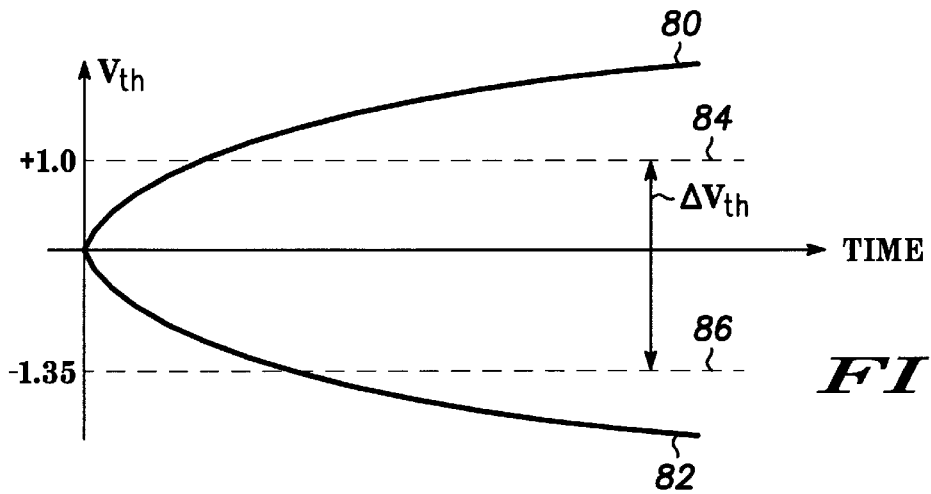
FIG. 4 is a graphical representation of the variations in threshold voltage of a memory cell with time during erasing and programming.

Referring now also to FIG. 4 which is a graph where the horizontal axis corresponds to time and the vertical axis corresponds to threshold voltage. The curve 80 is a graphical representation of the change in threshold voltage Vth of a floating gate transistor as the transistor is erased for the case when the threshold voltage of a programmed cell is negative and less than that of an erased cell which is positive. The threshold voltage of a programmed cell may of course be positive and/or even greater than that of an erased cell. The curve 82 is a graphical representation of the change in threshold voltage Vth of a floating gate transistor as the transistor is programmed.

The prior art verify technique discussed above compares the current flowing through the floating gate transistor with a reference current. When the current through the transistor reaches the reference current, a signal indicating that the flip point (i.e. the point at which the cell changes from a programmed to an erased state or vice versa) has been detected is generated. However, at this point, the threshold voltage is not measured and so it is not determined whether the cell is properly erased or programmed. Thus, on the next verify cycle, the sense amplifier may detect that the cell is not erased or not programmed respectively. This may occur around the flip point due to, for example, variations in temperature. For this reason, a margin is added when selecting the value of the reference current such that when the flip point is detected, the cell is either properly erased or properly programmed. However, by adding a margin, this increases the value of ΔVth. The difference ΔVth represents the time in the program and erase cycles when a sense amplifier typically senses that a cell is programmed or that a cell is erased. This difference ΔVth must be kept to a minimum otherwise the stress on the cells may become a problem.

The erase verify voltage signal Vabse is a voltage signal having a predetermined voltage level that corresponds substantially to a threshold voltage level of an erased memory cell in the array. The predetermined voltage level will vary from process to process depending on the characteristic of the device but is selected such that it corresponds to the threshold voltage level at which it is known that the memory cell is erased plus preferably a first margin. The predetermined level of the erase verify voltage signal Vabse is indicated on FIG. 4 by the line 84. In the preferred embodiment, the predetermined level of the erase verify voltage signal Vabse is +1.0 volts. The program verify voltage signal Vabsp is a voltage signal having a predetermined voltage level that corresponds substantially to a threshold voltage level of a programmed memory cell in the array. This level will also vary with process etc. but is selected such that it corresponds to the threshold level at which it is known that the memory cell is programmed plus preferably a second margin. The predetermined level for the program verify voltage signal is indicated on FIG. 4 by the line 86. In the preferred embodiment, the predetermined level for the program verify voltage signal Vabsp is −1.35 volts.

The predetermined levels for the erase verify voltage signal and the program verify voltage signal may be set during manufacture of the EEPROM or may be programmable, for example by programming a bit in EEPROM. An advantage of having programmable predetermined levels is that these levels can be optimised according to process, temperature etc.

The program verify cycle and erase verify cycle in accordance with a preferred embodiment of the present invention will now be described with reference to the two-transistor arrangement shown in FIG. 3 and with reference to FIGS. 2, 4 and 5.

At the beginning of a write cycle after a read cycle (i.e. time t0 in FIG. 5), the associated bit line of a memory cell is at zero volts (irrespective of whether the memory cell is to be programmed or erased), the bit line control coupled to the control terminal of the select transistor of a selected cell is biased to a voltage Vdd (compared to zero volts for an unselected cell) and the voltage on the row control is zero volts.

An erase cycle starts at time t1.

During an erase cycle of a memory cell, the row control associated with the cell to be erased is biased to a high positive erase voltage such as +12 volts, the associated bit line of the cell to be erased is then biased to a low negative voltage with respect to the row control, such as −1 volts, and the bit line control of the selected cell is biased to a positive voltage of 4.5 volts such that the select transistor of the selected cell is rendered conductive and the floating gate transistor of the selected cell is erased. As can be seen from FIG. 4, during erasing, the threshold voltage of the floating gate transistor increases. The erase cycle ends at time t2.

A program cycle then starts at time t3.

During a program cycle, the row control associated with the cell to be programmed is biased to a high negative program voltage such as −13 volts, the associated bit line of the cell to be programmed is then biased to a moderately high positive voltage with respect to the row control, such as +3.5 volts, and the bit line control of the selected cell is biased to a positive voltage 4.5 volts such that select transistor of the selected cell is rendered conductive and the floating gate transistor of the cell is programmed to a conductive state. As can be seen from FIG. 4, during programming, the threshold voltage of the floating gate transistor decreases. The program cycle ends at time t4.

A given row has a plurality of bit lines each corresponding to a cell in the row. Since the row control runs through multiple bits in a given row, it is desirable to isolate those cells that are to remain in an erased state and prevent programming. This is done by applying a bias voltage to the bit lines associated with cells that are not to be programmed. The biasing voltage is at ground or a low voltage level, such as −1 volts.

A program verify cycle then starts at time t5.

During a program verify cycle, row control associated with the cell to be programmed is biased to the level of the program verify voltage signal Vabsp (−1.35 volts), the bit line of the selected cell is pre-charged to a voltage of typically about 1 volt and the bit line control of the select transistor is biased to a voltage Vdd to render the select transistor conductive. For verifying the correct programming of cell 42, the sense amplifier 50 compares the current sunk by the memory cell 42 with the reference current from current source 52 and for as long as the threshold voltage of the floating gate transistor 44 has a value such that the voltage across the memory cell (Vabsp−Vth) is less than that required to sink the same amount of current as the reference current from the current source 52, then the sense amplifier 50 detects that the memory cell 42 is in an erased state and provides at an output 53 a program verify signal having a fourth value. This signal is fed to memory controller 24. As soon as the threshold voltage of the floating gate transistor 44 is small enough such that the current sunk by the memory cell 42 is equal to the reference current, the sense amplifier 50 detects that the memory cell 42 has switched to the programmed state and provides at the output 53 a program verify signal having a third value. When the program verify signal switches from the fourth value to the third value, the memory controller 24 knows that the threshold voltage of the floating gate transistor 44 has reached the desired level (86 on FIG. 4) imposed by the program verify voltage signal Vabsp. The program verify cycle ends at time t6.

An erase verify cycle begins at time t7.

During an erase verify cycle, row control associated with the cell to be erased is biased to the level of the erase verify voltage signal Vabse (+1 volts), the bit line of the selected cell is pre-charged to a voltage of typically about 1 volt and the bit line control of the select transistor of the selected cell is biased to a voltage Vdd such that the select transistor is rendered conductive. In order to verify the correct erasing of cell 42, the sense amplifier 50 compares the current sunk by the memory cell 42 with the reference current from current source 52 and for as long as the threshold voltage of the floating gate transistor 44 has a value such that the voltage across the memory cell (Vabse−Vth) is sufficient to ensure that the current sunk by the memory cell 42 is greater than or equal to the reference current from the current source 52, then the sense amplifier 50 detects that the memory cell 42 is in a programmed state and provides at an output 53 an erase verify signal having a second value. This signal is fed to memory controller 24. As soon as the current sunk by the memory cell 42 is less than the reference current, the sense amplifier 50 detects that the memory cell 42 has switched to the erased state and provides at the output 53 an erase verify signal having a first value. When the erase verify signal switches from the second value to the first value, the memory controller 24 knows that the threshold voltage of the floating gate transistor 44 has reached the desired level (84 on FIG. 4) imposed by the erase verify voltage signal Vabse. The erase verify cycle ends at time t8.

The erase time (t2−t1) and the program time (t4−t3) may be the same length of time and may be adjusted according to processing parameters, the size of the memory. Similarly the erase verify time (t8−t7) and the program verify time (t6−t5) may also be the same length of time.

Figure 5:
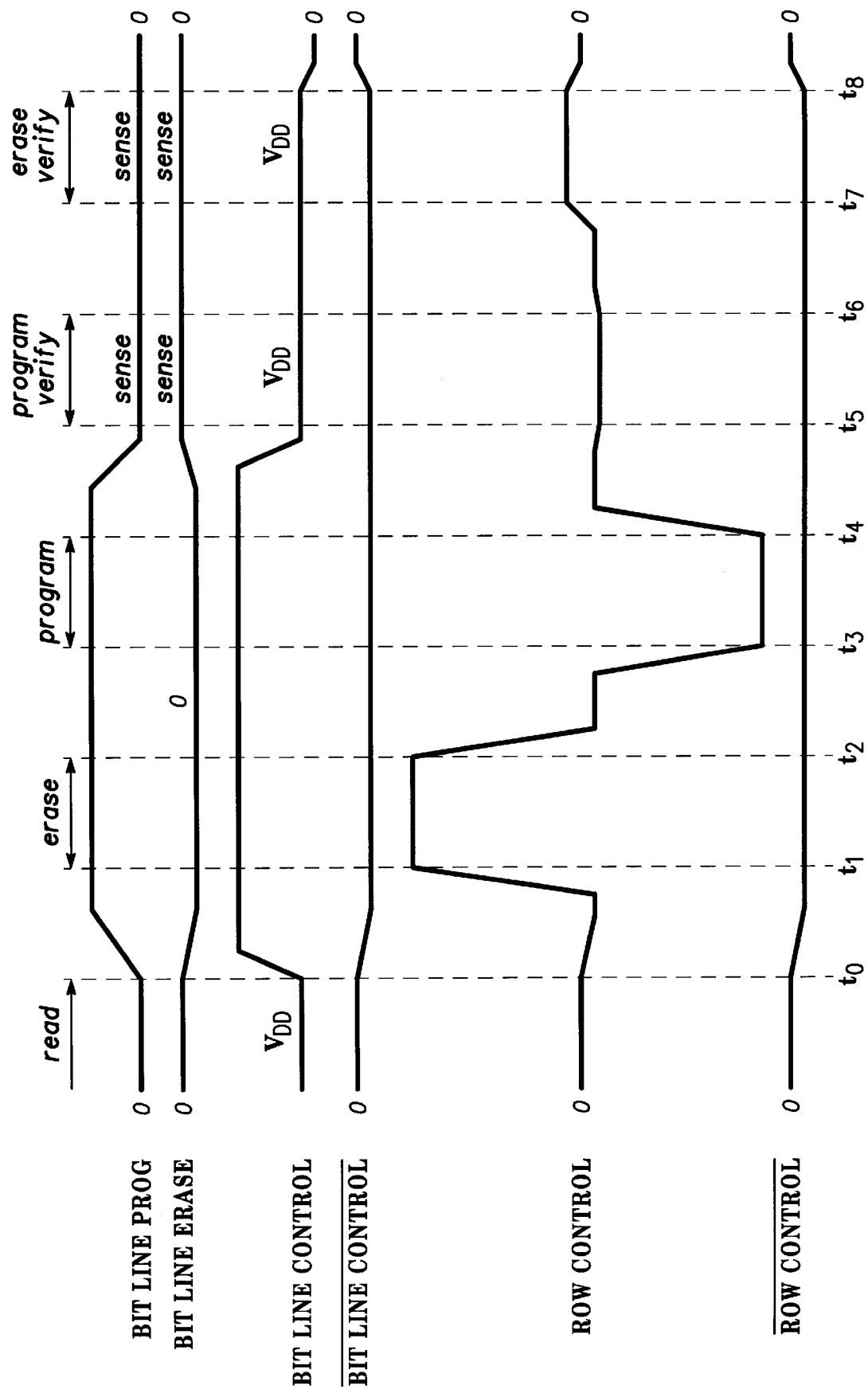
FIG. 5 is a timing diagram corresponding to a method for verifying data stored in a memory system after a write cycle in accordance with a preferred embodiment of the present invention.

If at time t8, the memory controller 24 detects that the program verify signal has the fourth value or the erase verify signal has the second value then the memory controller 24 initiates another write cycle followed by a verify cycle as shown in FIG. 5. This is repeated until the program verify signal has the third value and the erase verify signal has the first value. In other words, the program loops through a write cycle and a verify cycle until it is verified that the memory has been properly written to.

In FIG. 5, the write cycle comprises an erase cycle followed by a program cycle. The write cycle may comprise an erase cycle only, a program cycle only, or a program cycle followed by an erase cycle. The program flow may comprise program cycle, program verify cycle, erase cycle, erase verify cycle or program cycle, erase cycle, program verify cycle, erase verify cycle or any other combinations thereof.

Moreover, it may comprise, once all the bits to be erased have been verified as erased, a program cycle, followed by an erase verify cycle and a program verify cycle and similarly once all the bits to be programmed have been verified as programmed, an erase cycle, followed by an erase verify cycle and a program verify cycle. Whatever the flow, the program loops until it has been verified that the memory has been properly written to as indicated by the values of the program verify signal and the erase verify signal.

The two-transistor memory cell and the sense amplifier of FIG. 3 have been used to describe the invention by way of an example only. Other memory cell structures and also techniques for detecting the state of the memory cell (i.e. programmed or erased) may be used.

Figure 6:
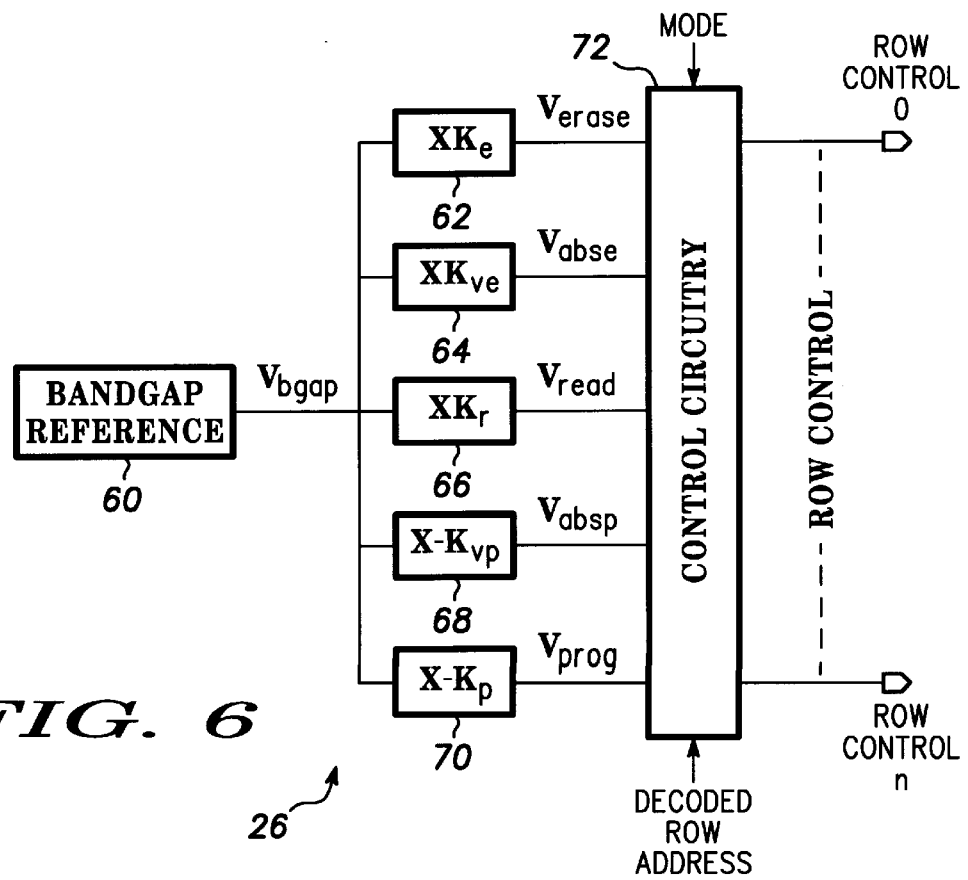
FIG. 6 is a block schematic diagram of a voltage controller in accordance with a preferred embodiment of the present invention for use in the memory system shown in FIG. 2.

Referring now to FIG. 6 which is a block schematic diagram of a voltage controller 26 in accordance with a preferred embodiment of the present invention. The voltage controller 26 comprises a bandgap reference 60 which generates an absolute reference voltage Vbgap with respect to ground, which reference voltage is stable with respect to temperature and process variations. The absolute reference voltage Vbgap is multiplied by a plurality of multipliers 62–70 so as to generate a plurality of different voltage signals: erase voltage signal (Verase), erase verify voltage signal (Vabse), program verify voltage signal (Vabsp), program voltage signal (Vprog) and even the read voltage signal (Vread). The read voltage signal (Vread) may be generated by another circuit. Table 1 below sets out the preferred levels of the voltage signals generated by the multipliers 62–70 for the cycles of the memory cell of FIG. 3 described above. Each multiplier may be implemented for example by an attenuator plus buffer, amplifier, regulated charge pump. Reference voltage controllers other than a bandgap reference may also be used.

| Voltage Signal | Voltage Level |
| --- | --- |
| Erase voltage signal (Verase) | +12.00 Volts |
| Erase verify voltage signal (Vabse) | +1.00 Volts |
| Read voltage signal (Vread) | 0.00 Volts |
| Program verify voltage signal (Vabsp) | −1.35 Volts |
| Program voltage signal (Vprog) | −13.00 Volts |

The voltage signals at the outputs of the multipliers 62–70 are fed to control circuitry 72. Control circuitry 72 also receives a mode control signal MODE from the memory controller 24 and Decoded Row Address from the row decoder 30. The mode control signal indicates the mode of operation of the memory array: that is, erase cycle, program cycle, read cycle, erase verify cycle, program verify cycle, plus others. The Decoded Row Address signal provides an indication of which row(s) of the array 22 are to be selected. The control circuitry 72 provides one of the voltage signals Verase, Vabse, Vread, Vabsp, Vprog according to the mode of operation to selected row control(s). FIG. 6 shows the rows row control0-row controln for an array comprising n rows.

By using an absolute voltage on the control line of the memory cell to verify the contents of the memory after an erase cycle and an absolute voltage on the control line of the memory cell to verify the contents of the memory after a program cycle, the present invention bounds the upper (erase) and lower (program) limits of the threshold voltage of the memory cell in an absolute manner. Stress on the transistor is therefore kept to a minimum.

Furthermore, by selecting appropriate levels for the absolute voltages, the window between programmed and erased threshold voltages ($\Delta$Vth between lines 84 and 86 in FIG. 4) can be controlled and hence stress induced by over-programming and/or over-erasing can be eliminated.

Furthermore, by introducing margins when selecting appropriate levels for the absolute voltages, the preferred embodiment ensures that additional write accesses and/or verify accesses are no longer required, thus reducing the erase/programming time.

Preferably, the absolute voltages are generated by a bandgap reference which ensures that the voltages are substantially stable with temperature and process variations.

In the preferred embodiment, the absolute voltages are programmable, for example through the multiplying factors K, which has an advantage in that the voltages can then be optimised for each device. Furthermore, such an arrangement is flexible enough to allow compensation for aging.

The invention has been described wherein the cell has two operating states: programmed or erased. It will be appreciated that the invention may also be used for memory devices having multiple operating states. For example, a device may have more than one programmed state and/or more than one erased state. Each of the states would have an associated threshold voltage. Thus, for multiple erase states more than one erase verify voltage signal will be required and for multiple program states more than one program verify voltage signal will be required.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A memory system comprising:
   a memory array having a plurality of memory cells arranged in rows and columns, wherein each memory cell has a control terminal; and
   a voltage controller for providing to the control terminal of a memory cell a first verify voltage signal during a first verify cycle or a second verify voltage signal during a second verify cycle, the first verify voltage signal having a predetermined voltage level that corresponds substantially to a threshold voltage level of a memory cell in the array in a first state and the second verify voltage signal having a predetermined voltage level that corresponds substantially to a threshold voltage level of a memory cell in the array in a second state.

2. A memory system according to claim 1 wherein the first verify voltage signal is an erase verify voltage signal, the first verify cycle is an erase verify cycle and the first state is an erased state and wherein the second verify voltage signal is a program verify voltage signal, the second verify cycle is a program verify cycle and the second state is a programmed state.

3. A memory system according to claim 2 wherein the voltage level of the erase verify voltage signal corresponds to the threshold voltage of an erased memory cell plus a first margin and wherein the voltage level of the program verify voltage signal corresponds to the threshold voltage of a programmed memory cell plus a second margin.

4. A memory system according to claim 2 wherein the voltage levels of the erase verify voltage signal and the program verify voltage signal are programmable.

5. A memory system according to claim 2 wherein the voltage controller comprises a bandgap voltage controller.

6. A memory system according to claim 5 wherein the voltage controller comprises:
   a bandgap voltage controller for generating a bandgap voltage signal;
   a first voltage multiplier coupled to receive the bandgap voltage signal for multiplying the bandgap voltage signal by a first factor to provide the erase verify voltage signal; and
   a second voltage multiplier coupled to receive the bandgap voltage signal for multiplying the bandgap voltage signal by a second factor to provide the program verify voltage signal.

7. A memory system according to claim 2 wherein the voltage controller is arranged to provide to the control terminals of each of the memory cells in a row an erase voltage signal during an erase cycle and a program voltage signal during a program cycle.

8. A memory system according to claim 5 wherein the voltage controller comprises:
   a bandgap voltage controller for generating a bandgap voltage signal;
   a first voltage multiplier coupled to receive the bandgap voltage signal for multiplying the bandgap voltage signal by a first factor to provide the erase verify voltage signal;
   a second voltage multiplier coupled to receive the bandgap voltage signal for multiplying the bandgap voltage signal by a second factor to provide the program verify voltage signal;
   a third voltage multiplier coupled to receive the bandgap voltage signal for multiplying the bandgap voltage signal by a third factor to provide the erase voltage signal; and
   a fourth voltage multiplier coupled to receive the bandgap voltage signal for multiplying the bandgap voltage signal by a fourth factor to provide the program voltage signal.

9. A memory system comprising:
   a memory array having a plurality of memory cells arranged in rows and columns wherein each memory cell has a control terminal;
   a voltage controller for providing to the control terminal of a memory cell in a row a first verify voltage signal during a first verify cycle or a second verify voltage signal during a second verify cycle, the first verify voltage signal having a predetermined voltage level that corresponds substantially to a threshold voltage level of a memory cell in the array in a first state and the second verify voltage signal having a predetermined voltage level that corresponds substantially to a threshold voltage level of a memory cell in the array in a second state;
   circuitry coupled to the memory array for reading data stored in a memory cell and in response during a first verify cycle providing a first verify signal, the first verify signal having a first value when the data in a memory cell switches to the first state and a second value when the data in the memory cell is in the second state, and in response during a second verify cycle providing a second verify signal, the second verify signal having a third value when the data switches to the second state and a fourth value when the data cell is in the first state; and
   memory controller coupled to the memory array and the circuitry for ending a write access when the first verify signal is at the first value and when the second verify signal is at the third value.

10. A memory system according to claim 9 wherein the first verify voltage signal is an erase verify voltage signal, the first verify cycle is an erase verify cycle, the first verify signal is an erase verify signal and the first state is an erased state and wherein the second verify voltage signal is a program verify voltage signal, the second verify cycle is a program verify cycle, the second verify signal is program verify cycle and the second state is a programmed state.

11. A memory system according to claim 10 wherein the voltage level of the erase verify voltage signal corresponds to the threshold voltage of an erased memory cell plus a first margin and wherein the voltage level of the program verify voltage signal corresponds to the threshold voltage of a programmed memory cell plus a second margin.

12. A memory system according to claim 10 wherein the voltage levels of the erase verify voltage signal and the program verify voltage signal are programmable.

13. A memory system according to claim 10 wherein the voltage controller comprises a bandgap voltage controller.

14. A memory system according to claim 13 wherein the voltage controller comprises:
   a bandgap voltage controller for generating a bandgap voltage signal;
   a first voltage multiplier coupled to receive the bandgap voltage signal for multiplying the bandgap voltage signal by a first factor to provide the erase verify voltage signal; and
   a second voltage multiplier coupled to receive the bandgap voltage signal for multiplying the bandgap voltage signal by a second factor to provide the program verify voltage signal.

15. A memory system according to claim 10 wherein the voltage controller is arranged to provide to the control terminals of each of the memory cells in a row an erase voltage signal during an erase cycle and a program voltage signal during a program cycle.

16. A memory system according to claim 13 wherein the voltage controller comprises:
   a bandgap voltage controller for generating a bandgap voltage signal;
   a first voltage multiplier coupled to receive the bandgap voltage signal for multiplying the bandgap voltage signal by a first factor to provide the erase verify voltage signal;
   a second voltage multiplier coupled to receive the bandgap voltage signal for multiplying the bandgap voltage signal by a second factor to provide the program verify voltage signal;
   a third voltage multiplier coupled to receive the bandgap voltage signal for multiplying the bandgap voltage signal by a third factor to provide the erase voltage signal; and
   a fourth voltage multiplier coupled to receive the bandgap voltage signal for multiplying the bandgap voltage signal by as fourth factor to provide the program voltage signal.

17. A method for verifying data stored in a memory array after a write cycle, the memory array comprising a plurality of memory cells arranged in rows and columns, each memory cell having a control terminal, the method comprising the steps of:
   performing an erase verify cycle on a memory cell to be erased comprising the steps of:
      applying an erase verify voltage signal to the control terminal of the memory cell, the erase verify voltage signal having a predetermined voltage level that corresponds substantially to a threshold voltage level of an erased memory cell in the array, and reading the data stored in the memory cell and in response providing an erase verify signal, the erase verify signal having a first value when the data switches to an erased state and a second value when the data is in the programmed state;

performing a program verify cycle on a memory cell to be programmed comprising the steps of:

applying a program verify voltage signal to the control terminal of the memory cell, the program verify voltage signal having a predetermined voltage level that corresponds substantially to a threshold voltage level of a programmed memory cell in the array, and reading the data stored in the memory cell and in response providing a program verify signal, the program verify signal having a third value when the data switches to a programmed state and a fourth value when the data cell is in the erased state; and terminating a write access when the erase verify signal is at the first value and the program verify signal is at the third value.

18. A method for writing to a memory array, the memory array comprising a plurality of memory cells arranged in rows and columns, each memory cell having a control terminal, the method comprising the steps of:

performing an erase cycle which includes applying an erase voltage signal to the control terminal of a memory cell;

performing an erase verify cycle on a memory cell to be erased comprising the steps of:

applying an erase verify voltage signal to the control terminal of the memory cell, the erase verify voltage signal having a predetermined voltage level that corresponds substantially to a threshold voltage level of an erased memory cell in the array, and reading the data stored in the memory cell and in response providing an erase verify signal, the erase verify signal having a first value when the data switches to an erased state and a second value when the data is in the programmed state;

performing a program cycle which includes applying a program voltage signal to the control terminal of a memory cell;

performing a program verify cycle on a memory cell to be programmed comprising the steps of:

applying a program verify voltage signal to the control terminal of the memory cell, the program verify voltage signal having a predetermined voltage level that corresponds substantially to a threshold voltage level of a programmed memory cell in the array, and reading the data stored in the memory cell and in response providing a program verify signal, the program verify signal having a third value when the data switches to a programmed state and a fourth value when the data cell is in the erased state;

repeating the erase cycle and erase verify cycle until the erase verify signal is at the first value; and repeating the program cycle and program verify cycle until the program verify signal is at the third value.

19. A memory system according to claim 7 wherein the voltage controller comprises:

a bandgap voltage controller for generating a bandgap voltage signal;

a first voltage multiplier coupled to receive the bandgap voltage signal for multiplying the bandgap voltage signal by a first factor to provide the erase verify voltage signal;

a second voltage multiplier coupled to receive the bandgap voltage signal for multiplying the bandgap voltage signal by a second factor to provide the program verify voltage signal;

a third voltage multiplier coupled to receive the bandgap voltage signal for multiplying the bandgap voltage signal by a third factor to provide the erase voltage signal; and a fourth voltage multiplier coupled to receive the bandgap voltage signal for multiplying the bandgap voltage signal by a fourth factor to provide the program voltage signal.

20. A memory system according to claim 15 wherein the voltage controller comprises:

a bandgap voltage controller for generating a bandgap voltage signal;

a first voltage multiplier coupled to receive the bandgap voltage signal for multiplying the bandgap voltage signal by a first factor to provide the erase verify voltage signal;

a second voltage multiplier coupled to receive the bandgap voltage signal for multiplying the bandgap voltage signal by a second factor to provide the program verify voltage signal;

a third voltage multiplier coupled to receive the bandgap voltage signal for multiplying the bandgap voltage signal by a third factor to provide the erase voltage signal; and a fourth voltage multiplier coupled to receive the bandgap voltage signal for multiplying the bandgap voltage signal by as fourth factor to provide the program voltage signal.

* * * * *